(12) United States Patent
Ohashi

(10) Patent No.: US 8,309,450 B2
(45) Date of Patent: Nov. 13, 2012

(54) METHOD FOR FABRICATING SEMICONDUCTOR DEVICE

(75) Inventor: Takuo Ohashi, Kuwana (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,410

(22) Filed: Sep. 16, 2011

(65) Prior Publication Data

US 2012/0252201 A1    Oct. 4, 2012

(30) Foreign Application Priority Data

Mar. 30, 2011  (JP) ................. 2011-076437

(51) Int. Cl.
*H01L 21/3205* (2006.01)
(52) U.S. Cl. .. 438/592; 438/201; 438/211; 257/E21.679
(58) Field of Classification Search .................. 438/201, 438/211, 257, 258, 264, 266, 592–594; 257/E21.679
See application file for complete search history.

(56) References Cited

U.S. PATENT DOCUMENTS

| 7,902,030 | B2 | 3/2011 | Ito et al. |
| 2008/0160784 | A1 * | 7/2008 | Yang ............................. 438/763 |
| 2011/0127578 | A1 | 6/2011 | Ito et al. |

FOREIGN PATENT DOCUMENTS

JP    2008-80498    4/2008

\* cited by examiner

*Primary Examiner* — Thanhha Pham
(74) *Attorney, Agent, or Firm* — Oblon, Spivak, McClelland, Maier & Neustadt, L.L.P.

(57) ABSTRACT

According to one embodiment, a method for fabricating a semiconductor device including a memory cell portion and a select gate portion, the method includes etching a charge accumulation layer, a tunnel insulating film, and a semiconductor substrate to make a trench, burying a first insulating film in the trench to contact with a side surface of the charge accumulation layer, performing heat processing to compress the first insulating film, forming a second insulating film on the charge accumulation layer and the first insulating film, etching the second insulating film in the select gate portion to expose a surface of the charge accumulation layer, forming a silicon layer to contact with the exposed surface of the charge accumulation layer, forming a metal layer on the silicon layer, and performing heat processing to silicide an entire boundary region between the charge accumulation layer and the tunnel insulating film.

18 Claims, 11 Drawing Sheets

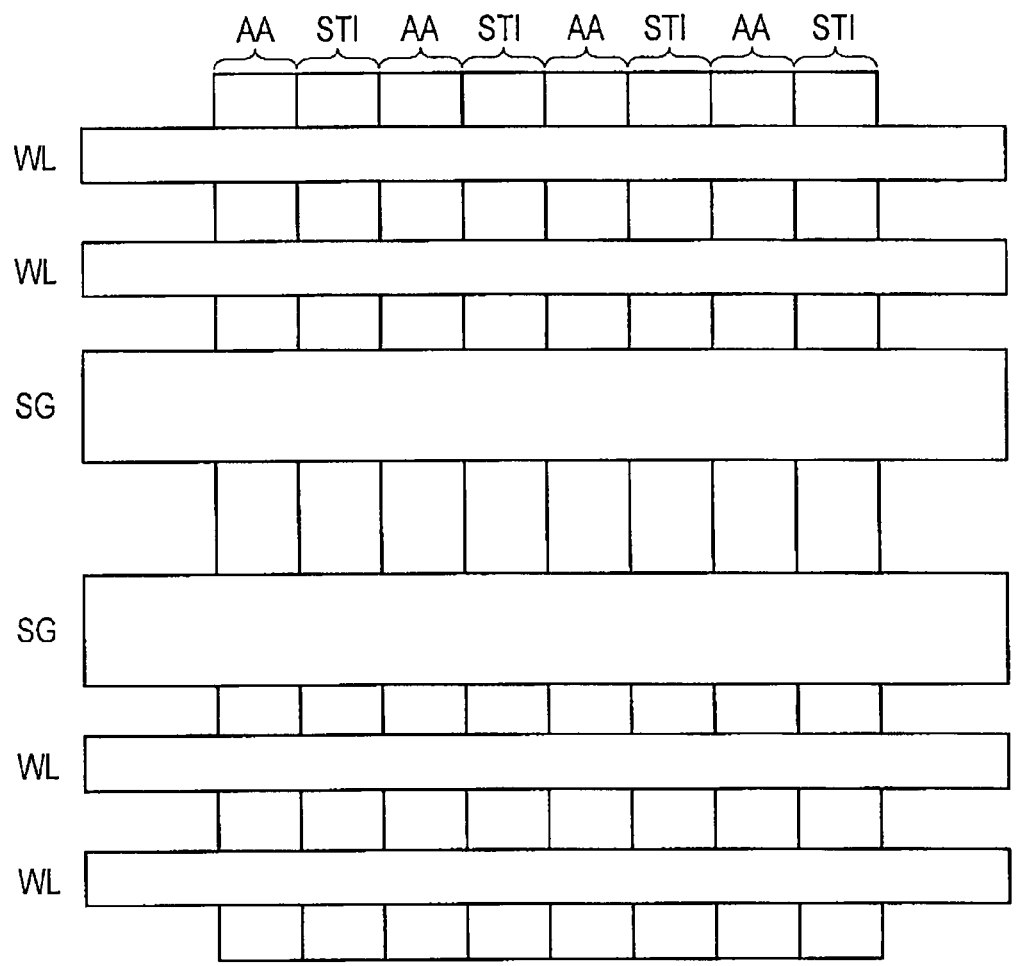
F I G. 1

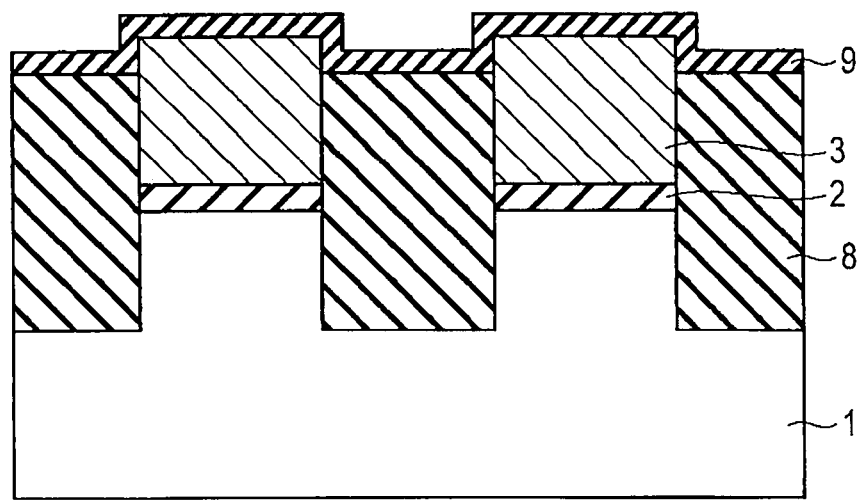
F I G. 10A
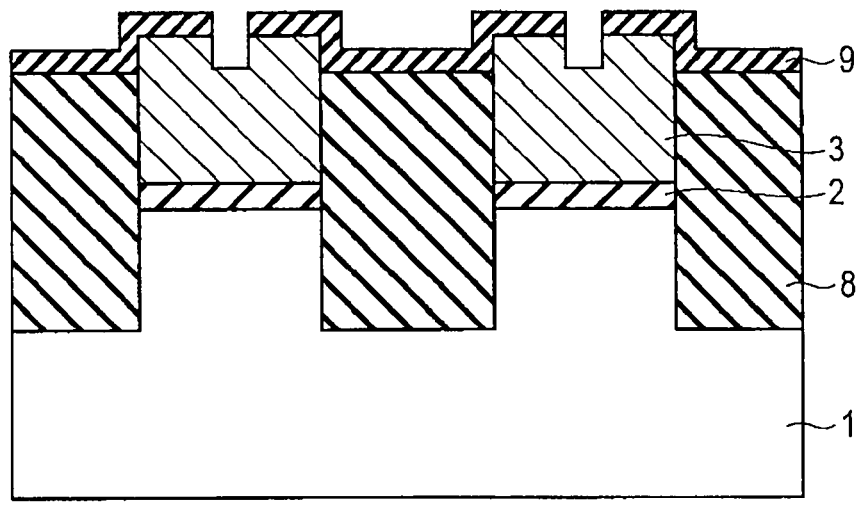
F I G. 10B

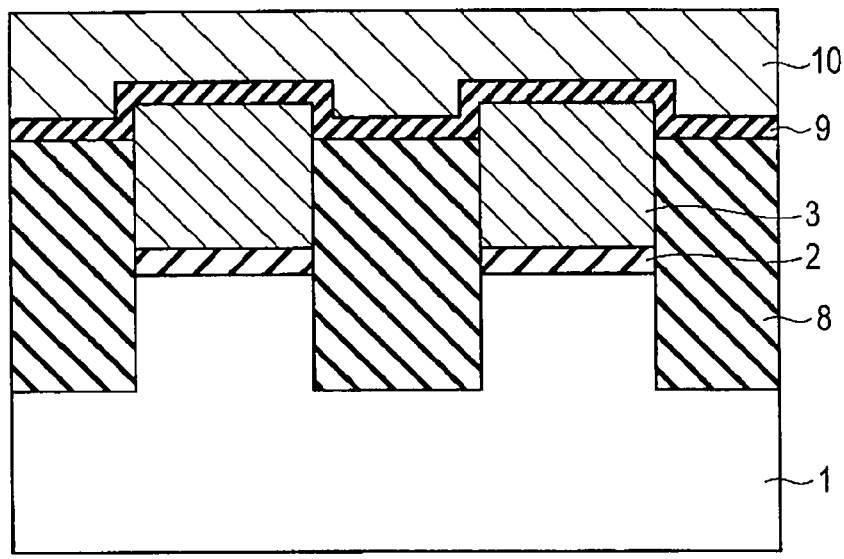
F I G. 11A
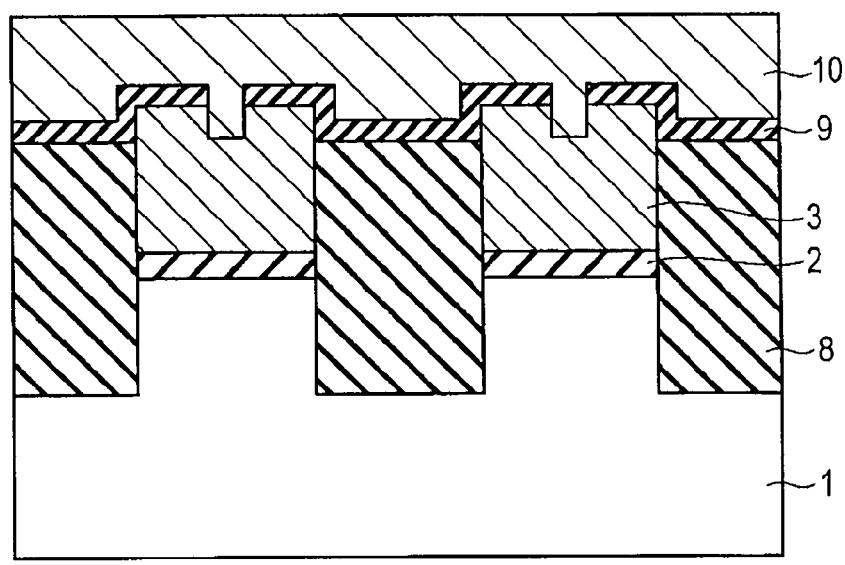
F I G. 11B

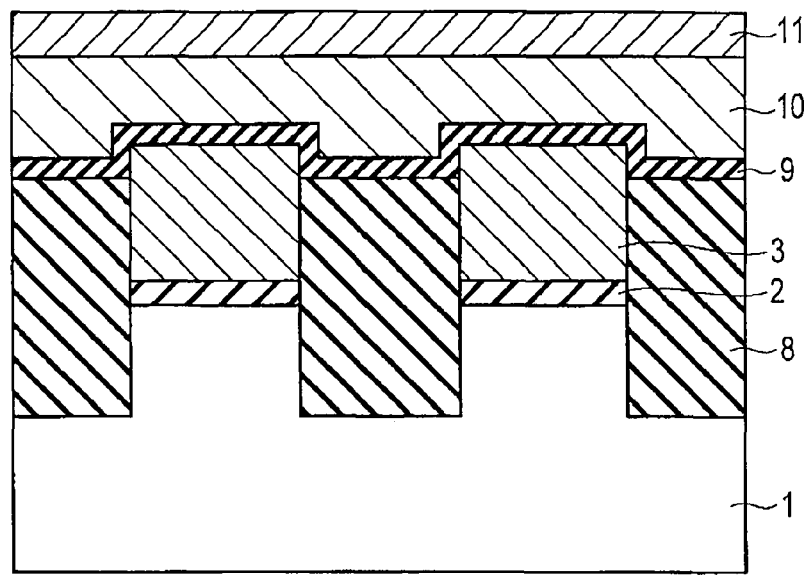
F I G. 12A
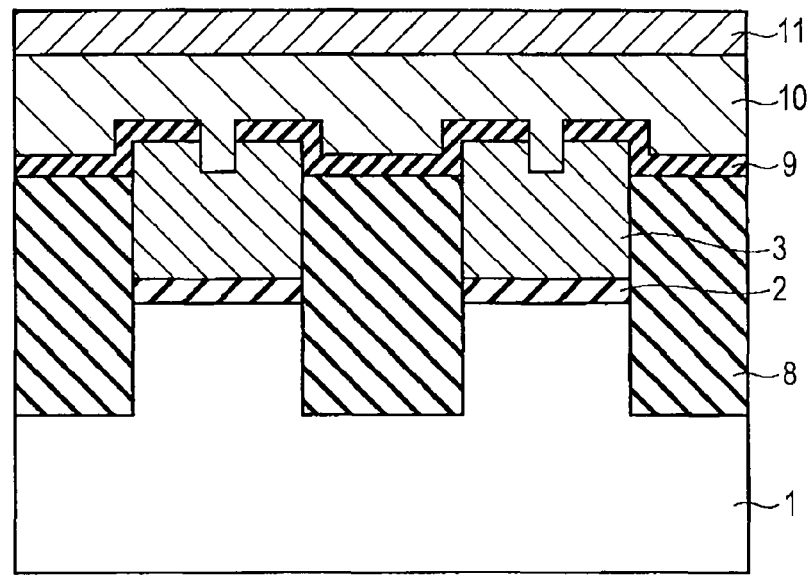
F I G. 12B

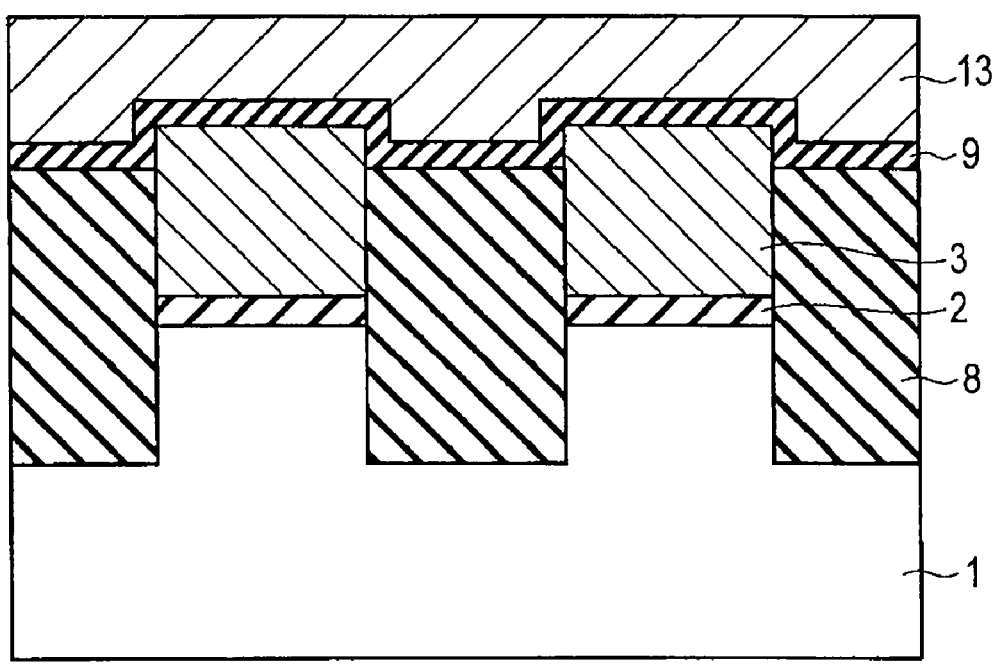
F I G. 14

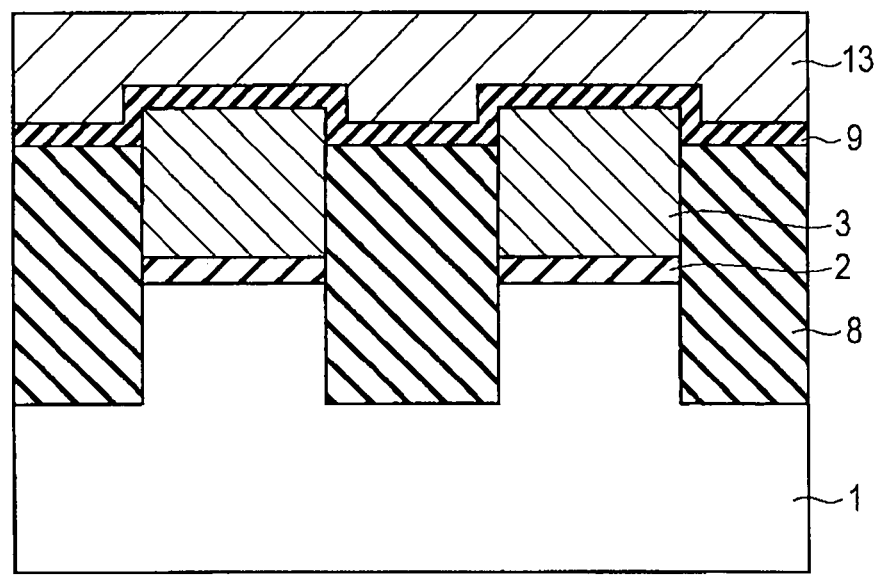
F I G. 15A
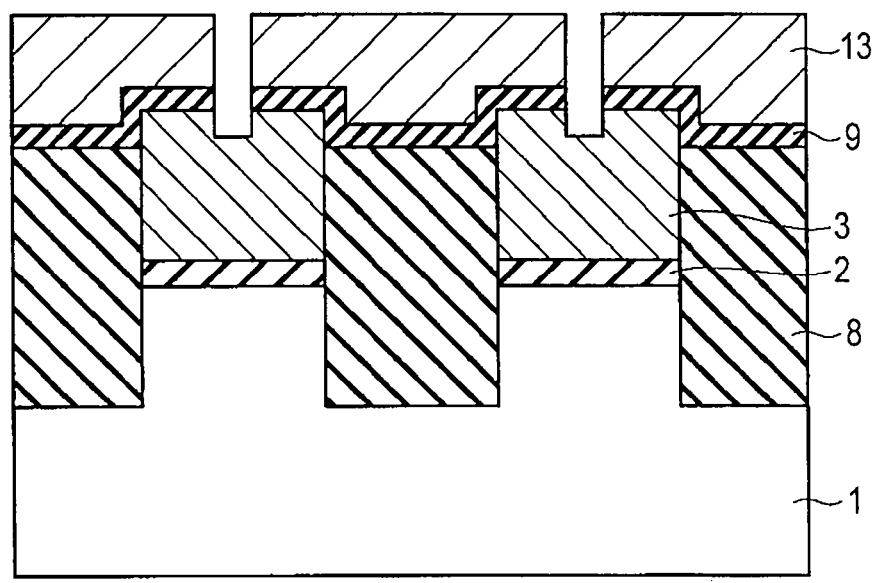
F I G. 15B

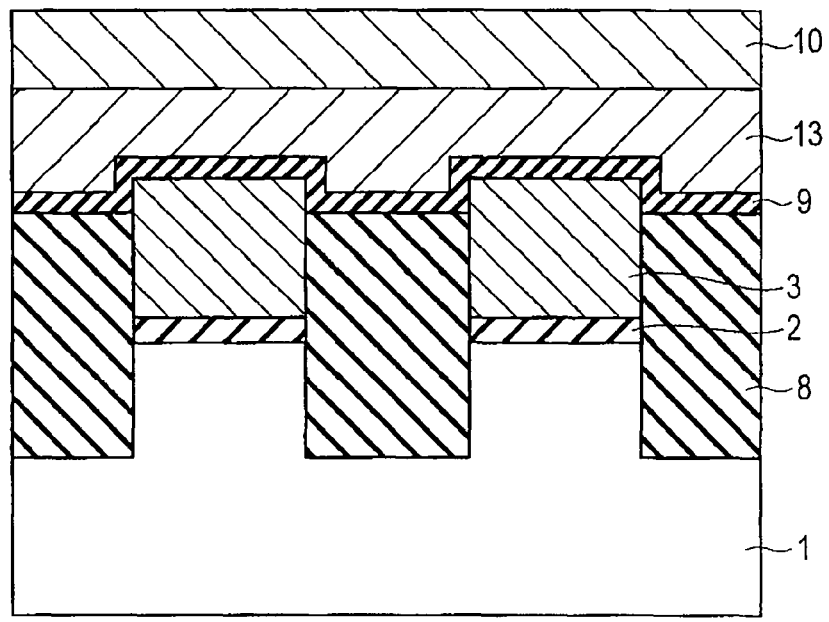
F I G. 16A
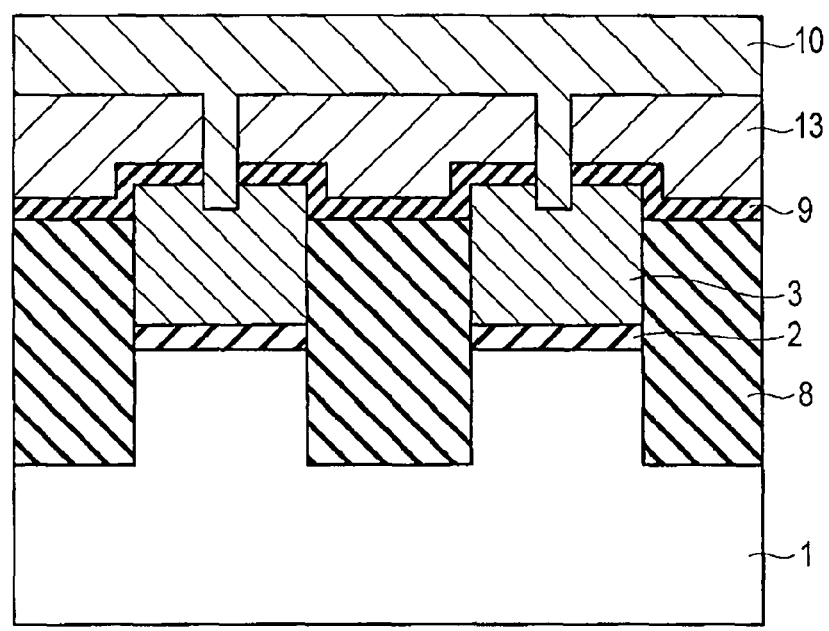
F I G. 16B

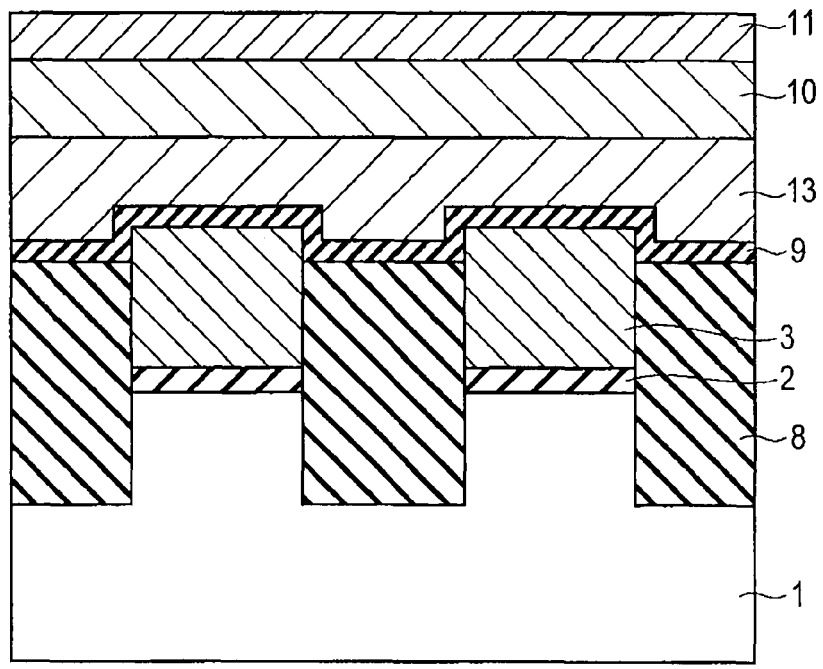
F I G. 17A
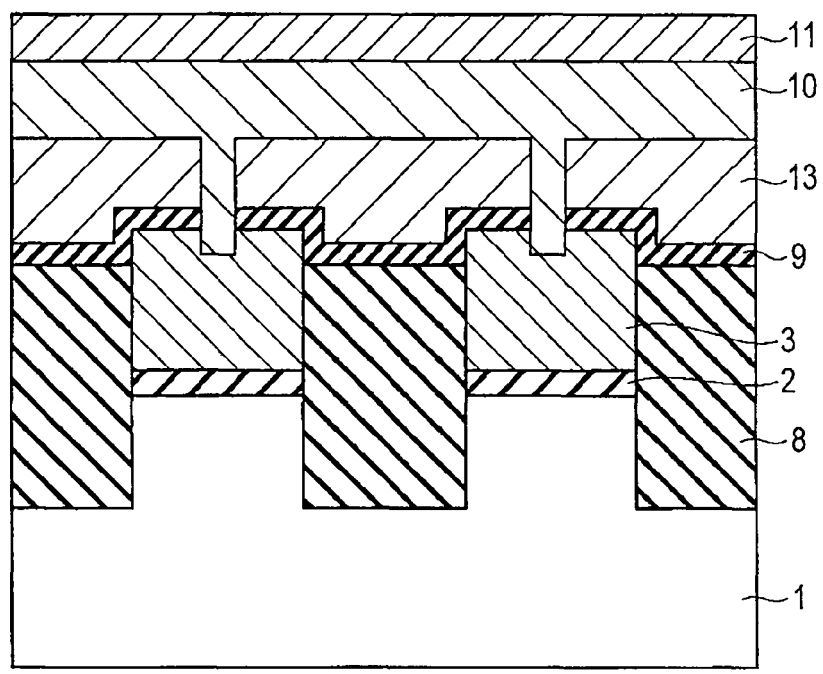
F I G. 17B

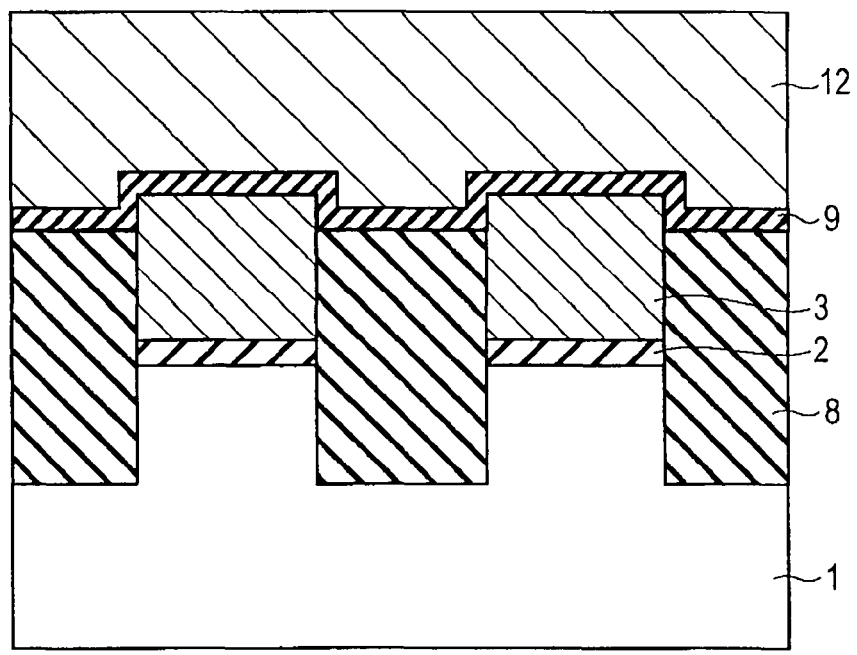
F I G. 18A
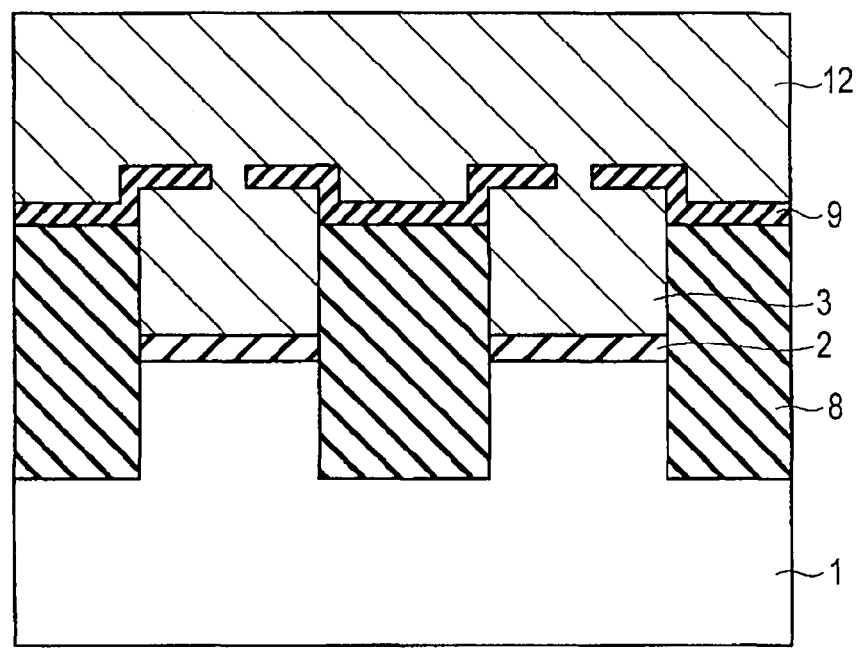
F I G. 18B

METHOD FOR FABRICATING SEMICONDUCTOR DEVICE

CROSS-REFERENCE TO RELATED APPLICATIONS

This application is based upon and claims the benefit of priority from prior Japanese Patent Application No. 2011-076437, filed Mar. 30, 2011, the entire contents of which are incorporated herein by reference.

FIELD

Embodiments described herein relate generally to a method for fabricating a semiconductor device.

BACKGROUND

In recent years, memory cells in NAND flash memories have become increasingly miniaturized. This has led to a reduction in the width of word lines for the memory cells and thus an increase in the interconnect resistance of the word lines. Thus, to reduce the interconnect resistance, much effort has been made to provide a structure that uses a metal silicide layer as an interconnect.

A select gate portion of a NAND flash memory suffers the following problem. A gate electrode in the select gate portion is silicidated. Consequently, a silicide layer contacts a gate insulating film, thus varying the threshold voltage of the select gate. Hence, various measures have been taken to prevent the silicide layer from contacting the gate insulating film. However, the increasing miniaturization of the memory cells results in formation of pinholes in a polysilicon layer. Thus, a silicide layer is formed in a part of a boundary region of a tunnel insulating film (i.e. a gate insulating film). This disadvantageously varies the threshold voltage of the select gate.

BRIEF DESCRIPTION OF THE DRAWINGS

FIG. 1 is a plan view showing a memory cell array in a semiconductor device according to a first embodiment and a second embodiment;

FIG. 10A to FIG. 13A are cross-sectional views taken along the word line direction and illustrating the method for fabricating a semiconductor device according to the first embodiment, the views showing a memory cell;

FIG. 10B to FIG. 13B are cross-sectional views taken along the word line direction and illustrating the method for fabricating a semiconductor device according to the first embodiment, the views showing a select gate portion;

FIG. 14 is a cross-sectional view taken along the word line direction and illustrating a method for fabricating a semiconductor device according to the second embodiment;

FIG. 15A to FIG. 18A are cross-sectional views taken along the word line direction and illustrating the method for fabricating a semiconductor device according to the second embodiment, the views showing a memory cell portion; and FIG. 15B to FIG. 18B are cross-sectional views taken along the word line direction and illustrating the method for fabricating a semiconductor device according to the second embodiment, the views showing a select gate portion.

DETAILED DESCRIPTION

In general, according to one embodiment, a method for fabricating a semiconductor device including a memory cell portion and a select gate portion, the method includes: etching a charge accumulation layer, a tunnel insulating film, and a semiconductor substrate to make a trench; burying a first insulating film in the trench to contact with a side surface of the charge accumulation layer; performing heat processing to compress the first insulating film; forming a second insulating film on the charge accumulation layer and the first insulating film; etching the second insulating film in the select gate portion to expose a surface of the charge accumulation layer; forming a silicon layer to contact with the exposed surface of the charge accumulation layer; forming a metal layer on the silicon layer; and performing heat processing to silicide an entire boundary region between the charge accumulation layer and the tunnel insulating film.

First Embodiment

A semiconductor device and a method for fabricating the semiconductor device according to the first embodiment will be described.

1. Configuration of the Semiconductor Device According to the Present Embodiment First, a configuration of the semiconductor device according to the present embodiment will be described with reference to FIG. 1. FIG. 1 is a plan view of a memory cell array in the semiconductor device according to the first embodiment.

As shown in FIG. 1, in the semiconductor device according to the present embodiment, active regions AA and isolation regions STI are alternately provided so that the adjacent active regions are electrically isolated from each other by each isolation region STI. Furthermore, word lines WL and select gates SG are periodically arranged; the word lines WL and the select gates SG cross the active regions AA and isolation regions STI at right angles, the word lines WL control the gate voltage of a transistor in each memory cell section, and the select gates SG select a page to which data is to be written.

2. Method for Fabricating a Semiconductor Device According to the Present Embodiment Now, a method for fabricating the semiconductor device shown in FIG. 1 will be described. FIG. 2 to FIG. 9, FIG. 10A to FIG. 13A, and FIG. 10B to FIG. 13B are cross-sectional views taken along a word line direction and sequentially illustrating the method for fabricating the semiconductor device according to the present embodiment. FIG. 10A to FIG. 13A show a memory cell portion. FIG. 10B to FIG. 13B show a select gate portion in steps illustrated in FIG. 10A to FIG. 13A. Steps in FIG. 2 to FIG. 9 are common to both the select gate portion and the memory cell portion.

Figure 2:
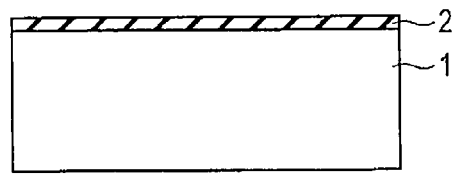
FIG. 2 to FIG. 9 are cross-sectional views taken along a word line direction and illustrating a method for fabricating a semiconductor device according to the first embodiment.

First, as shown in FIG. 2, a surface of a silicon substrate 1 is thermally oxidized at 600 to 1,000° C. in a dry oxygen atmosphere. Thus, for example, a silicon oxide layer is formed as a tunnel insulating film 2. The silicon oxide layer may be formed by a chemical vapor deposition (CVD) method or an atomic layer deposition (ALD) method.

Figure 3:
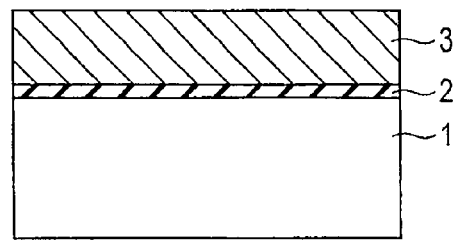

Then, as shown in FIG. 3, for example, polycrystalline silicon with phosphorous (P) doped therein is formed on the tunnel insulating film 2 by the CVD method so as to serve as a charge accumulation layer 3. The charge accumulation layer 3 is, for example, about 100 nm in layer thickness. If the concentration of P in the polysilicon is greater than or equal to a solid solubility limit, the dose of P of $2 \times 10^{20}$ to $3 \times 10^{20}$ cm$^{-3}$ to the polysilicon allows P atoms to be generated in crystal grain boundaries. This weakens the bonding among Si atoms, thus making crystal grain boundaries likely to be generated.

That is, pinholes are easily generated in the charge accumulation layer. This facilitates silicidation of the charge accumulation layer 3.

Figure 4:
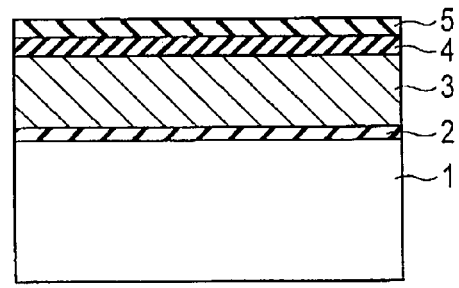

Then, as shown in FIG. 4, a silicon oxide layer 4 is formed on the charge accumulation layer 3 by the CVD method. A method for forming the silicon oxide layer 4 includes, for example, introducing dichlorosilane ($SiH_2Cl_2$) and nitrous oxide ($N_2O$) into a reactor kept at 600 to 800° C. and maintaining the pressure in the reactor at 0.1 to 5 Torr. The silicon oxide layer 4 is, for example, about 10 nm in layer thickness.

Subsequently, as shown in FIG. 4, a silicon nitride layer 5 is formed on the silicon oxide layer 4 by the CVD method. A preferable method for forming the silicon nitride layer 5 includes introducing dichlorosilane ($SiH_2Cl_2$) and ammonia ($NH_3$) into the reactor maintained at 600 to 800° C. The silicon nitride layer 5 is, for example, about 15 nm in layer thickness.

Figure 5:
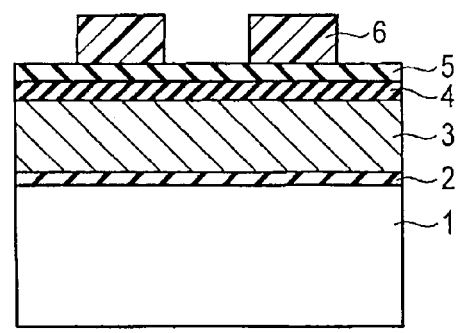

Then, a photoresist 6 is deposited by a coating method. As shown in FIG. 5, the photoresist 6 is then patterned into a striped form by a photolithography method.

Figure 6:
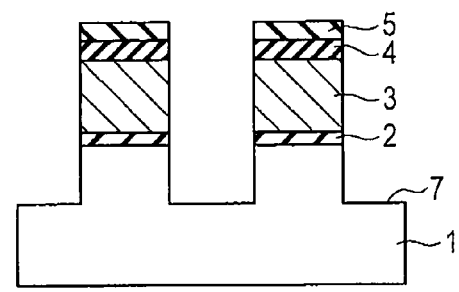

Then, as shown in FIG. 6, the silicon nitride layer 5 and the silicon oxide layer 4 are etched by a reactive ion etching (RIE) method using the photoresist 6 as a mask. Thereafter, the photoresist 6 is removed. The charge accumulation layer 3, the tunnel insulating film 2, and the silicon substrate 1 are then etched by RIE using the silicon oxide layer as a mask. This step may be modified such that the photoresist 6 is not removed until the etching of the charge accumulation layer 3, the tunnel insulating film 2, and the silicon substrate 1 is completed. Then, the surface of the silicon substrate 1 is exposed to make trenches 7 for isolating elements as shown in FIG. 6. The trenches 7 are inversely tapered under normal etching conditions. In the present embodiment, the etching conditions are desirably such that each of the corners of the trench 7 is close to 90 degrees in angle. Then, an element isolation insulator 8 to be formed in a subsequent step has a large volume. This results in a high tensile stress exerted on the charge accumulation layer 3. That is, pinholes are easily made well defined in the charge accumulation layer 3, thus facilitating silicidation of the charge accumulation layer 3 described below.

Figure 7:
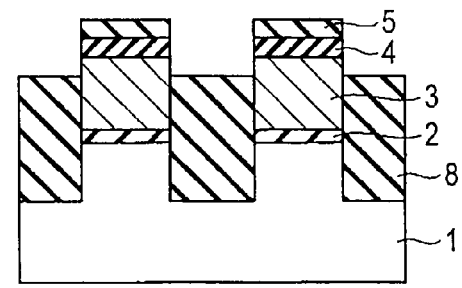

Then, as shown in FIG. 7, polysilazane (PSZ) is deposited in the trenches 7 so as to contact side surfaces of the charge accumulation layer 3. Thereafter, a surface of the deposited polysilazane is flattened by a chemical mechanical polishing (CMP) method until a surface of the silicon nitride layer 5 is exposed. Thus, the element isolation insulator 8 is buried in the trenches 7 so as to contact the side surfaces of the charge accumulation layer 3. The insulator 8 may be compressed (constricted) by heat processing. Instead of the polysilazane, for example, a silicon oxide layer formed by a plasma CVD method, may be used as a material for the insulator 8. When used as the insulator 8, the polysilazane is easily compressed by the heat processing, allowing a high tensile stress to be exerted on the charge accumulation layer 3. Hence, pinholes are easily made well defined in the charge accumulation layer 3.

Then, heat processing is carried out in a nitrogen atmosphere at 850 to 1100° C. for 30 minutes to 120 minutes. Thus, the polysilazane, serving as the insulator 8, is compressed, allowing tensile stress to be exerted on the charge accumulation layer 3, which is in contact with the first insulator 8. As a result, crystal grain boundaries are generated in the polysilicon, serving as the charge accumulation layer 3. Hence, pinholes are made.

Longer heat processing at high temperature allows the polysilazane, used as the insulator 8, to be more significantly compressed. This results in a higher tensile stress exerted on the charge accumulation layer 3. That is, pinholes are easily made well defined in the charge accumulation layer 3, thus facilitating silicidation of inside of the charge accumulation layer 3 described below.

Furthermore, the polysilazane, used as the insulator B, is conventionally formed by oxidation based on heat processing. Thus, the present embodiment can make the pinholes in the charge accumulation layer 3 well defined by the heat processing without the need to use more fabrication steps than the conventional technique.

Then, RIE with etching selection ratio between the silicon nitride layer 5 and the insulator 8 is used to selectively etch the insulator B down to the height of a top surface of the charge accumulation layer 3 (or a height lower than the top surface of the charge accumulation layer 3 and higher than a bottom layer of the charge accumulation layer 3). As a result, the configuration in FIG. 7 is obtained.

Figure 8:
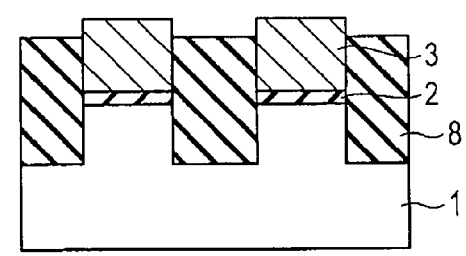

Then, as shown in FIG. 8, the remaining silicon nitride layer 5 is selectively wet-etched with a mixed solution of phosphoric acid and water at about 200° C. Subsequently, the silicon oxide layer 5 is removed, for example, with hydrofluoric acid. At this time, the hydrofluoric acid infiltrates into the pinholes in the charge accumulation layer 3. This further makes the pinholes in the charge accumulation layer 3 well defined.

Figure 9:
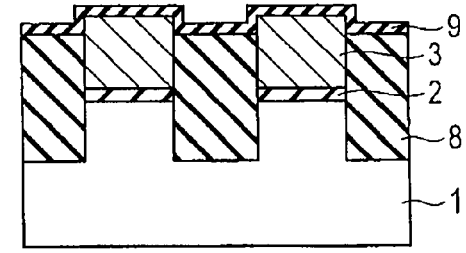

Then, as shown in FIG. 9, an ONO layer (a stacked layer of a silicon oxide layer, a silicon nitride layer, and a silicon oxide layer) is formed by the CVD method so as to serve as an inter-gate insulating film 9.

As shown in FIG. 10B, in the select gate portion, the inter-gate insulating film 9 is etched so as to expose the surface of the charge accumulation layer 3. This etching is carried out, for example, by the photolithography using, as a mask, the patterned photoresist on the inter-gate insulating film 9. Moreover, in the select gate portion, after the inter-gate insulating film 9 is etched, the charge accumulation layer 3 may be etched. In this case, connection holes made by the etching easily join to the pinholes generated in the charge accumulation layer 3. This allows the charge accumulation layer 3 to be more easily silicidated. The charge accumulation layer 3 is etched to the extent that a top surface of the tunnel insulating film 2 is not exposed, for example, until the film thickness of the charge accumulation layer reaches about 10 nm. At this time, in the memory cell portion, the inter-gate insulating film insulator 9 is not etched as shown in FIG. 10A.

Then, chemical treatment with hydrofluoric acid is carried out in order to remove native oxide formed on the surface of the charge accumulation layer 3. At this time, the hydrofluoric acid infiltrates into the pinholes in the charge accumulation layer 3 through the connection holes. This further makes the pinholes in the charge accumulation layer 3 well defined.

Then, as shown in FIG. 11B, in the select gate portion, a silicon layer 10 is formed so as to cover the inter-gate insulating film 9 and to be buried in the connection holes. The silicon layer 10 may be, for example, silicon to which P is doped by introducing monosilane ($SiH_4$) and phosphine ($PH_3$) into the reactor maintained at a temperature of 400 to 700° C. and a pressure of 0.1 to 5 Torr. In this step, the silicon layer 10 is not buried in the pinholes, which thus remain. At this time, in the memory cell portion, the silicon layer 10 is formed so as to cover the inter-gate insulating film 9 as shown in FIG. 11A.

Then, as shown in FIG. 12A and FIG. 12B, in the memory cell portion and the select gate portion, a metal layer 11 is formed on the silicon layer 10. The metal layer 11 is a Ni layer formed by, for example, a sputter method. Alternately, the metal layer 11 may be a stack of a Ni layer and a Co layer.

Then, heat processing is carried out at 250 to 450° C. for 20 to 60 seconds using a lamp. Thus, in the select gate portion, as shown in FIG. 13B, for example, Ni atoms contained in the metal layer 11 diffuse through the silicon layer 10 and the charge accumulation layer 3 to form nickel monosilicide (NiSi) as a silicide layer 12. In particular, in the pinholes in the charge accumulation layer 3, the Ni atoms diffuse easily, allowing the NiSi layer to be formed not only on the charge accumulation layer 3 but also down to the boundary region between the charge accumulation layer 3 and the tunnel insulating film 2. That is, the polysilicon used as the charge accumulation layer 3 can be silicided all over the boundary region between the charge accumulation layer 3 and the tunnel insulating film 2. This allows the threshold voltage of the select gate SG to be stabilized. Furthermore, at this time, the whole charge accumulation layer 3 in the select gate portion may be fully silicided.

Figure 13A:
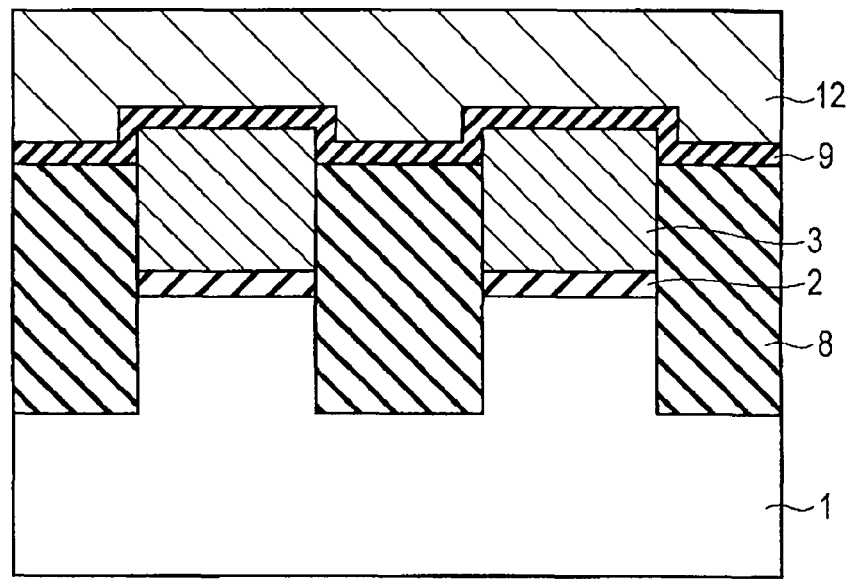
Figure 13B:
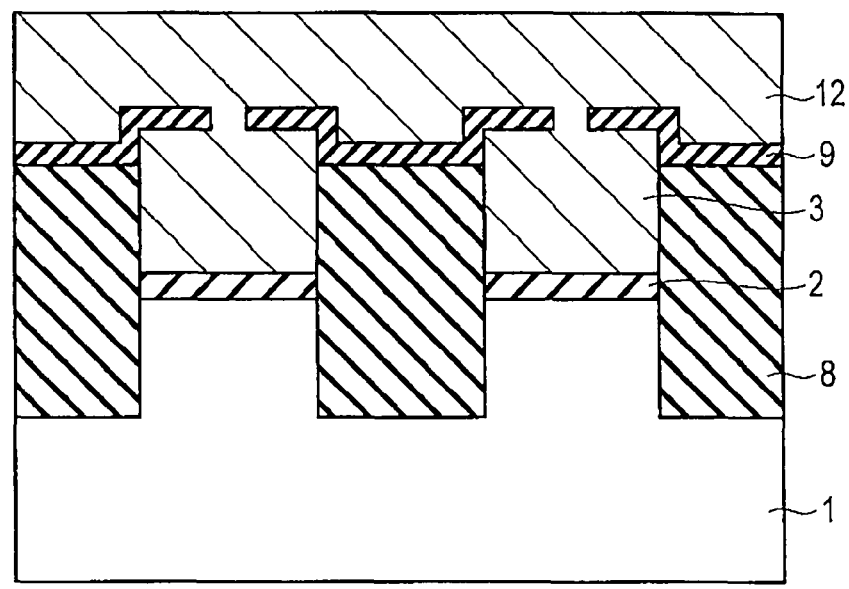

At this time, in the memory cell portion, Ni atoms contained in the metal layer 11 diffuse through the silicon layer 10 to form the silicide layer 12, as shown in FIG. 13A. Thus, in the select gate portion, the entire boundary region between the charge accumulation layer 3 and the tunnel insulating film 2 can be silicidated. Furthermore, in the memory cell portion, the interconnect can be silicided and thus reduced in resistance.

Then, the unreacted part of the metal layer 11, for example, an Ni layer, is removed with a mixed liquid of sulfuric acid and a hydrogen peroxide solution.

3. Advantages of the Present Embodiment

According to the first embodiment, the element isolation insulator 8 is compressed to apply tensile stress to the charge accumulation layer 3, which is in contact with the element isolation insulator 8. As a result, pinholes are formed in the charge accumulation layer 3. Thus, the metal atoms from the metal layer 11 diffuse to the boundary region between the charge accumulation layer 3 and tunnel insulating film 2 in the select gate portion. This leads to the formation of the silicide layer 12. That is, the interconnect is silicided and thus reduced in resistance, while in the select gate portion, the entire boundary region between the charge accumulation layer 3 and the tunnel insulating film 2 is silicided. This allows the threshold voltage of the select gate SG to be stabilized.

Moreover, the inter-electrode oxide layer is etched and then subjected to chemical treatment with hydrofluoric acid. Then, the hydrofluoric acid infiltrates into the pinholes in the charge accumulation later 3 to make the pinholes in the charge accumulation layer 3 well defined. Thus, the entire boundary region between the charge accumulation layer 3 and tunnel insulating film 2 in the select gate portion can be easily silicided.

Second Embodiment

Now, a method for fabricating a semiconductor device according to a second embodiment will be described. The present embodiment corresponds to the fabrication method described above in the first embodiment and in which a silicon layer 13 is formed so as to cover the inter-gate insulating film 9 before the step of etching the inter-gate insulating film 9 so as to expose the surface of the charge accumulation layer 3 in the select gate portion. The present embodiment is otherwise similar to the first embodiment. The following description focuses on differences from the first embodiment.

1. Method for Fabricating a Semiconductor Device

Now, a method for fabricating a semiconductor device according to the present embodiment will be described with reference to FIG. 14, FIG. 15A to FIG. 18A, and FIG. 15B to FIG. 18B. FIG. 14, FIG. 15A to FIG. 18A, and FIG. 15B to FIG. 18B are cross-sectional views taken along the word line direction and sequentially illustrating the method for fabricating a semiconductor device according to the present embodiment. FIG. 15A to FIG. 18A show a memory cell portion. FIG. 15B to FIG. 18B show a select gate portion in steps illustrated in FIG. 15A to FIG. 18A. A step in FIG. 14 is common to both the select gate portion and the memory cell portion.

First, the steps in FIG. 2 to FIG. 9 described in the first embodiment are carried out. That is, a tunnel insulating film 2 and a charge accumulation layer 3 are formed on the silicon substrate 1. Polysilazane as an element isolation insulator 8 is buried in the trench 7 for isolating elements. A inter-gate insulating film 9 is formed on the charge accumulation layer 3 and the insulator 8.

Then, as shown in FIG. 14, in the memory cell portion and the select gate portion, a silicon layer 13 is formed on the inter-gate insulating film 9. The silicon layer 13 may be, for example, a silicon layer to which P is doped by introducing monosilane ($SiH_4$) and phosphine ($PH_3$) into the reactor maintained at a temperature of 400 to 700° C. and a pressure of 0.1 to 5 Torr. The silicon layer 13 formed on the inter-gate insulating film 9 enables organic substances in the air to be prevented from adhering to the second insulator.

Then, as shown in FIG. 15B, in the select gate portion, the silicon layer 13 and the inter-gate insulating film 9 are etched so as to expose the surface of the charge accumulation layer 3. This etching is carried out, for example, using, as a mask, a photoresist on the silicon layer 13 which is patterned by an exposure and development step based on the photolithography. At this time, in the memory cell portion, the silicon layer 13 and the inter-gate insulating film 9 are not etched as shown in FIG. 15A.

In the present embodiment, the silicon layer 13 is formed on the inter-gate insulating film insulator 9. Thus, connection holes can be made in the inter-gate insulating film insulator 9 in the select gate portion without the inter-gate insulating film insulator 9 in the memory cell portion contacting with the photoresist or a developing fluid. This enables impurities to be prevented from adhering to the inter-gate insulating film insulator 9 in the memory cell portion, making the semiconductor device more reliable.

Moreover, in the select gate portion, after the inter-gate insulating film insulator 9 is etched, the charge accumulation layer 3 may be etched. The charge accumulation layer 3 is etched to the extent that a top surface of the tunnel insulating film 2 is not exposed, for example, until the film thickness of the charge accumulation layer reaches about 10 nm. In this case, the pinholes generated in the charge accumulation layer 3 connect easily to the connection holes. This allows the charge accumulation layer 3 to be more easily silicidated.

Then, chemical treatment with hydrofluoric acid is carried out in order to remove native oxide formed on the surface of the charge accumulation layer 3. At this time, the hydrofluoric acid infiltrates into the pinholes in the charge accumulation layer 3 through the connection holes. This further makes the pinholes in the charge accumulation layer 3 well defined.

Then, as shown in FIG. 16B, in the select gate portion, a silicon layer 10 is formed so as to cover the silicon layer 13 and to be buried in the connection holes. The silicon layer 10 may be, for example, silicon to which P is doped by introducing monosilane ($SiH_4$) and phosphine ($PH_3$) into the reactor maintained at a temperature of 400 to 700° C. and a pressure of 0.1 to 5 Torr. In this step, the silicon layer 10 is not buried in the pinholes, which thus remain. At this time, in the memory cell portion, the silicon layer 10 is formed so as to cover the silicon layer 13 as shown in FIG. 16A.

Then, as shown in FIG. 17A and FIG. 17B, in the memory cell portion and the select gate portion, a metal layer 11 is formed on the silicon layer 10. The metal layer 11 is a Ni layer formed by, for example, the sputter method. Alternately, the metal layer 11 may be a stack of a Ni layer and a Co layer.

Then, heat processing is carried out at 250 to 450° C. for 20 to 60 seconds using a lamp. Thus, in the select gate portion, as shown in FIG. 18B, for example, Ni atoms contained in the metal layer 11 diffuse through the silicon layer 10, the silicon layer 13, and the charge accumulation layer 3 to form nickel monosilicide (NiSi) as a silicide layer 12. In particular, in the pinholes in the charge accumulation layer 3, the Ni atoms diffuse easily, allowing silicidation not only of the top of the charge accumulation layer 3 but also of the polysilicon used as the charge accumulation layer 3 and covering the boundary region between the charge accumulation layer 3 and the tunnel insulating film 2. This enables the threshold voltage of the select gate SG to be stabilized. At this time, the whole charge accumulation layer 3 in the select gate section may be fully silicided.

Moreover, at this time, in the memory cell portion, Ni atoms contained in the metal layer 11 diffuse through the silicon layers 13 and 10 to form the silicide layer 12, as shown in FIG. 18A. Thus, in the select gate portion, the entire boundary region between the charge accumulation layer 3 and the tunnel insulating film 2 can be silicided. Furthermore, in the memory cell portion, the interconnect can be silicided and thus reduced in resistance.

Then, the unreacted part of the metal layer 11, for example, a Ni layer, is removed with a mixed liquid of sulfuric acid and a hydrogen peroxide solution.

2. Advantages of the Present Embodiment

In the method for fabricating a semiconductor device according to the second embodiment, the element isolation insulator 8 is constricted to apply tensile stress on the charge accumulation layer 3, which is in contact with the first insulator 8. As a result, pinholes are formed in the charge accumulation layer 3. Thus, the metal atoms from the metal layer 11 diffuse to the boundary region between the charge accumulation layer 3 and tunnel insulating film 2 in the select gate portion. This leads to the formation of the silicide layer 12. That is, the interconnect is silicided and thus reduced in resistance, while in the select gate portion, the entire boundary region between the charge accumulation layer 3 and the tunnel insulating film 2 is silicided. This allows the threshold voltage of the select gate SG to be stabilized.

Moreover, the inter-gate oxide layer is etched and then subjected to chemical treatment with hydrofluoric acid. Then, the hydrofluoric acid infiltrates into the pinholes in the charge accumulation later 3 to make the pinholes in the charge accumulation layer 3 well defined. Thus, the entire boundary region between the charge accumulation layer 3 and tunnel insulating film 2 in the select gate portion can be easily silicidated.

Moreover, after the silicon layer 13 covering the inter-gate insulating film 9 is formed, the connection holes are formed so as to penetrate the layers 13 and 9 and reach charge accumulation layer 3. Thus, connection holes can be formed in the inter-gate insulating film 9 in the select gate portion, with the inter-gate insulating film 9 in the memory cell portion avoiding contact with the photoresist or a developing fluid. This enables impurities to be prevented from adhering to the inter-gate insulating film 9 in the memory cell portion, making the semiconductor device more reliable.

Modifications

The present embodiments are not limited to the above method and may be modified in various manners. For example, the element isolation insulator 8 may be subjected to heat processing after CMP process. The heat processing is carried out, for example, in a nitrogen atmosphere at 850 to 1,100° C. for 30 to 120 minutes. The heat processing allows the polysilazane used as the element isolation insulator 8 to be constricted, applying more tensile stress on the charge accumulation layer 3. As a result, crystal grain boundaries are generated in the polysilicon used as the charge accumulation layer 3. Hence, more pinholes are formed.

Furthermore, each of the steps can be replaced with another appropriate step wherever possible. The materials and film thicknesses of the layers described above are only illustrative and may be appropriately changed. The above-described embodiments are applicable to semiconductors in general which include a charge accumulation layer, for example, NAND flash memories. However, the above-described embodiments are widely applicable even to semiconductor memories with no charge accumulation layer provided that silicidation is important for the semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for fabricating a semiconductor device including a memory cell portion and a select gate portion, the method comprising:
   forming a tunnel insulating film on a semiconductor substrate;
   forming a charge accumulation layer on the tunnel insulating film;
   etching the charge accumulation layer, the tunnel insulating film, and the semiconductor substrate to make a trench for isolating elements;
   burying a first insulating film in the trench to contact with a side surface of the charge accumulation layer;
   performing heat processing to compress the first insulating film;
   forming a second insulating film on the charge accumulation layer and the first insulating film;
   etching the second insulating film in the select gate portion to expose a surface of the charge accumulation layer;
   forming a silicon layer to contact with the exposed surface of the charge accumulation layer;
   forming a metal layer on the silicon layer; and
   performing heat processing to silicide an entire boundary region between the charge accumulation layer and the tunnel insulating film.

2. The method according to claim 1, further comprising making a pinhole in the charge accumulation layer by chemical treatment of the charge accumulation layer after etching the second insulating film and before forming the silicon layer.

3. The method according to claim 1, further comprising, in the etching of the second insulating film, further etching the charge accumulation layer in the select gate portion.

4. The method according to claim 1, wherein the first insulating film is polysilazane.

5. The method according to claim 1, wherein the charge accumulation layer has an impurity concentration greater than or equal to a solid solubility limit of the charge accumulation layer.

6. The method according to claim 1, wherein the first insulating film is compressed to apply tensile stress to the charge accumulation layer.

7. The method according to claim 1, further comprising removing a mask material for forming the trench by wet etching, after compressing the first insulating film and before forming the second insulating film.

8. The method according to claim 1, wherein the charge accumulation layer in the select gate portion is fully silicided.

9. The method according to claim 1, wherein the semiconductor device is a NAND flash memory.

10. A method for fabricating a semiconductor device including a memory cell portion and a select gate portion, the method comprising:
- forming a tunnel insulating film on a semiconductor substrate;
- forming a charge accumulation layer on the tunnel insulating film;
- etching the charge accumulation layer, the tunnel insulating film, and the semiconductor substrate to make a trench for isolating elements;
- burying a first insulating film in the trench to contact with a side surface of the charge accumulation layer;
- performing heat processing to compress the first insulating film;
- forming a second insulating film on the charge accumulation layer and the first insulating film;
- forming a first silicon layer on the second insulating film;
- etching the first silicon layer and second insulating film in the select gate portion to expose a surface of the charge accumulation layer;
- forming a second silicon layer on the first silicon layer and the charge accumulation layer to cover the first silicon layer and connect to the exposed surface of the charge accumulation layer;
- forming a metal layer on the second silicon layer; and
- performing heat processing to silicide the charge accumulation layer in the select gate portion which contacts the tunnel insulating film, thus silicidating an entire boundary region between the charge accumulation layer and the tunnel insulating film.

11. The method according to claim 10, further comprising making a pinhole in the charge accumulation layer by chemical treatment of the charge accumulation layer after etching the second insulating film and before forming the second silicon layer.

12. The method according to claim 10, further comprising, in the etching of the second insulating film, further etching the charge accumulation layer in the select gate portion.

13. The method according to claim 10, wherein the first insulating film is polysilazane.

14. The method according to claim 10, wherein the charge accumulation layer has an impurity concentration greater than or equal to a solid solubility limit of the charge accumulation layer.

15. The method according to claim 10, wherein the first insulating film is compressed to apply tensile stress to the charge accumulation layer.

16. The method according to claim 10, further comprising removing a mask material for forming the trench by wet etching, after compressing the first insulating film and before forming the second insulating film.

17. The method according to claim 10, wherein the charge accumulation layer in the select gate portion is fully silicided.

18. The method according to claim 10, wherein the semiconductor device is a NAND flash memory.

* * * * *